United States Patent [19]

Motoyama et al.

[11] Patent Number: 5,030,316
[45] Date of Patent: Jul. 9, 1991

[54] TRENCH ETCHING PROCESS

[75] Inventors: Takushi Motoyama, Kawasaki; Naomichi Abe, Tokyo; Satoru Mihara, Kawasaki, all of Japan

[73] Assignee: Fujitsu Limited, Kawasaki, Japan

[21] Appl. No.: 462,959

[22] Filed: Jan. 8, 1990

Related U.S. Application Data

[63] Continuation of Ser. No. 264,794, Oct. 31, 1988, abandoned.

[30] Foreign Application Priority Data

Oct. 29, 1987 [JP] Japan .................................. 62-274779

[51] Int. Cl.5 ...................... H01L 21/306; B44C 1/22; C03C 15/00; C03C 25/06
[52] U.S. Cl. .................................... 156/626; 156/643; 156/646; 156/653; 156/657; 156/659.1; 156/662; 156/663; 204/192.37; 204/192.33
[58] Field of Search ............... 156/626, 643, 646, 653, 156/657, 659.1, 662, 663; 427/38, 39; 204/192.32, 192.33, 192.35, 192.37

[56] References Cited

U.S. PATENT DOCUMENTS 4,496,425 1/1985 Kuyel .................................. 156/626

FOREIGN PATENT DOCUMENTS 0251626 12/1985 Japan .................................. 156/626
61-115326 6/1986 Japan .
0232619 10/1986 Japan .................................. 156/626
61-232620 10/1986 Japan .

Primary Examiner—William A. Powell
Attorney, Agent, or Firm—Staas & Halsey

[57] ABSTRACT

A trench etching process comprises the steps of: preparing a substrate, forming a mask pattern for the trench etching having a material different from that of the substrate, on the substrate, and detecting changes in results of emission spectroanalyses generated by etching the mask pattern and the substrate while using the etching ratios of the mask pattern and the silicon substrate to determine that the trench etching is completed.

3 Claims, 4 Drawing Sheets

REGION A          REGION B

REGION A   REGION B

REGION A   REGION B

REGION A    REGION B

REGION A    REGION B

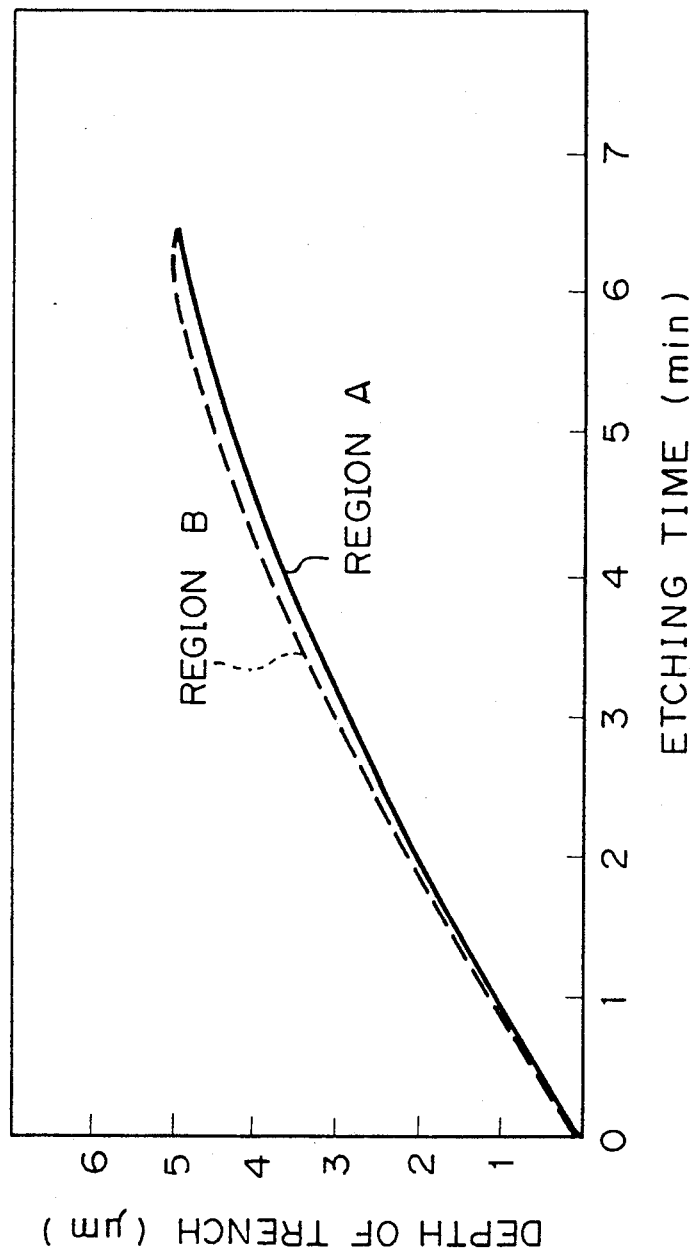

TRENCH ETCHING PROCESS

This is a continuation of copending application Ser. No. 07/264,794 filed on Oct. 31, 1988, abandoned.

BACKGROUND OF THE INVENTION

1. Field of the Invention

The present invention relates to a trench etching process. More particularly, it relates to a trench etching process wherein a completion of a required etching process in a trench can be determined by detecting a change in emission analysis results.

2. Description of the Related Art

With the enhancement of the degree of integration of IC's, the trench etching process for, for example, silicon, has become extremely important when miniaturizing the area of the isolation and capacitor cells.

In a trench etching process for producing a trench in a silicon substrate, a precise and reproducible control of the depth of the trench is difficult, since there is no layer which can act as a stopper layer, and accordingly, there is no known effective means for controlling the distribution of the respective depths of trenches over the entire surface of the silicon substrate.

A conventional trench etching process is shown in FIGS. 1A to 1C. As shown in FIG. 1A, a phosphosilicate glass (PSG) layer 2 having a thickness of, for example, 1.0 μm is formed on a silicon substrate 1. As shown in FIG. 1B, an opening 3 by which the silicon substrate 1 is exposed is formed in the PSG layer 2 in which a trench is to be formed, by photolithography. After forming the opening 3, as shown in FIG. 1C, a trench 4 is formed in the silicon substrate 1 by a reactive ion etching (RIE) process using the remaining PSG layer 2 as a mask.

The RIE process for producing a required trench is usually carried out by a time control. Namely, the time is predetermined by calculating the RIE etching rate of the silicon substrate. Further, the RIE process for producing the required trench is usually carried out while monitoring the depth of the trench by calculating a difference between the time when laser beam is reflected from the surface of the silicon substrate and from the bottom surface of the trench.

Such a conventional trench etching process, wherein a time control is carried out, is disadvantageous in that there is no guarantee that a required etching has been carried out, since no warning is given if a required etching is not realized due to unforeseen circumstances. Further, when the depth of trench is monitored by using a laser beam, etc., the monitoring precision is reduced due to the shape of the trench.

Japanese Unexamined Patent Publication (Kokai) No. 61-232620, published on Oct. 16, 1986, discloses a process for etching a semiconductor substrate wherein an etching end point is detected by monitoring the emission intensity of an atom or molecule or an ion of components of an etching mask. In this etching process, the completion of a trench etching can be precisely and reproducibly detected, but when many trenches having the same depth are formed in a silicon substrate, a uniform distribution of the depth of the trenches can not be obtained over an entire surface of the silicon substrate, since the etching mask is not directly laid on the silicon substrate and the etching rate of a film disposed between the etching mask and the silicon substrate is not the same as that of the silicon substrate.

SUMMARY OF THE INVENTION

Therefore, an object of the present invention is to provide a trench etching process wherein the completion of the trench etching can be precisely detected.

Another object of the present invention is to provide a trench etching process wherein a precise trench etching can be carried out reproducibly.

A further object of the present invention is to provide a trench etching process wherein trenches having substantially the same depth can be obtained over an entire surface of, for example, a silicon substrate.

According to the present invention, there is provided a trench etching process comprising the steps of:

preparing a substrate, forming a mask pattern for the trench etching process, the material of which pattern is different from that of said substrate, and on the substrate, detecting changes in results of an emission spectroanalyses, which changes are generated by etching said mask pattern as well as said substrate, and using the etching ratios of the mask pattern and the silicon substrate, to determine that the trench etching is completed.

In the present invention, preferably a silicon substrate is used.

Further, the mask pattern is preferably made of phospho-silicate glass or a thermal oxide of silicon.

BRIEF DESCRIPTION OF THE DRAWINGS

FIG. 3 is a graph illustrating a relationship between the etching time and the depth of trenches in each of regions A and B of the silicon substrate.

DESCRIPTION OF THE PREFERRED EMBODIMENTS

The preferred embodiment of the present invention will now be described with reference to the drawings.

FIGS. 2A to 2D are cross-sectional views of a substrate in successive stages of trench etching in accordance with an embodiment of the present invention and FIG. 3 is a graph illustrating a relationship between the etching time and the depth of trenches in regions A and B of the silicon substrate.

Figure 1A:
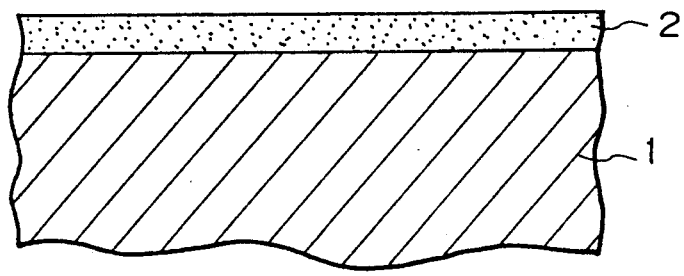
FIGS. 1A to 1C are cross-sectional views explaining the processes of the prior art.
Figure 1B:
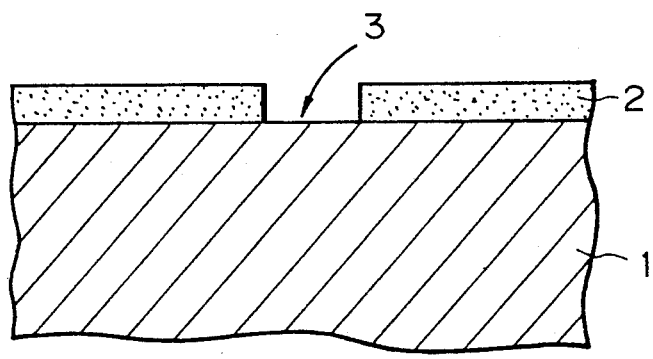
Figure 1C:
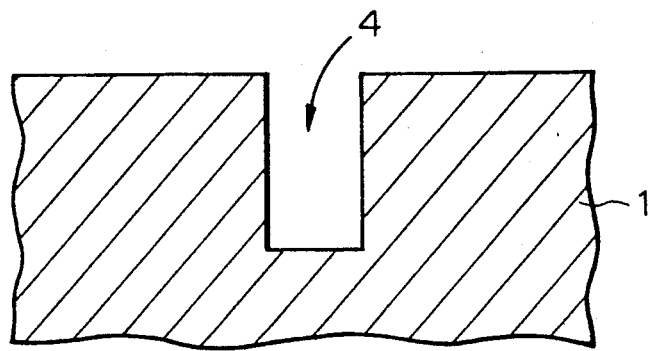
Figure 2A:
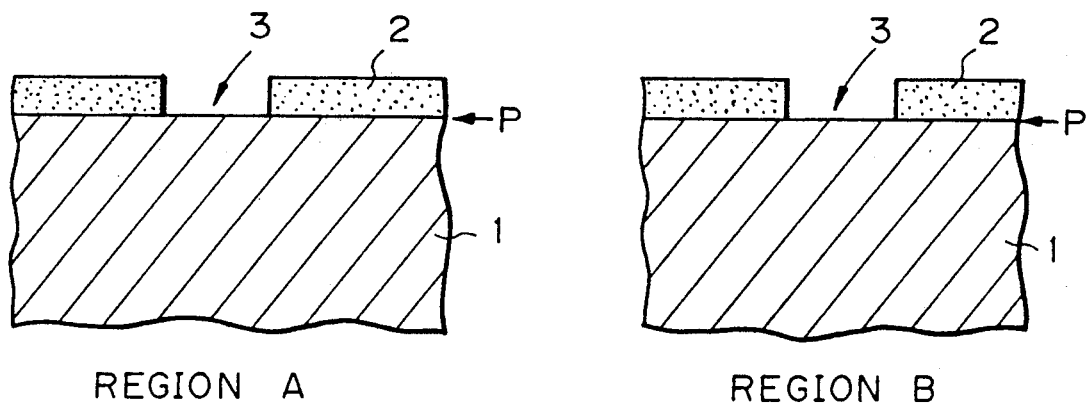
FIGS. 2A to 2D are cross-sectional views of an embodiment of the process of the present invention.

As shown in FIG. 2A, an etching mask of, for example, phosphosilicate glass (PSG) film 2, having a thickness of 1 μm is formed on a surface of a silicon substrate 1. Note, FIG. 2A shows cross-sectional views of two regions of the silicon substrate 1, i.e., REGION A and REGION B. P denotes a surface of the substrate 1.

Figure 2B:
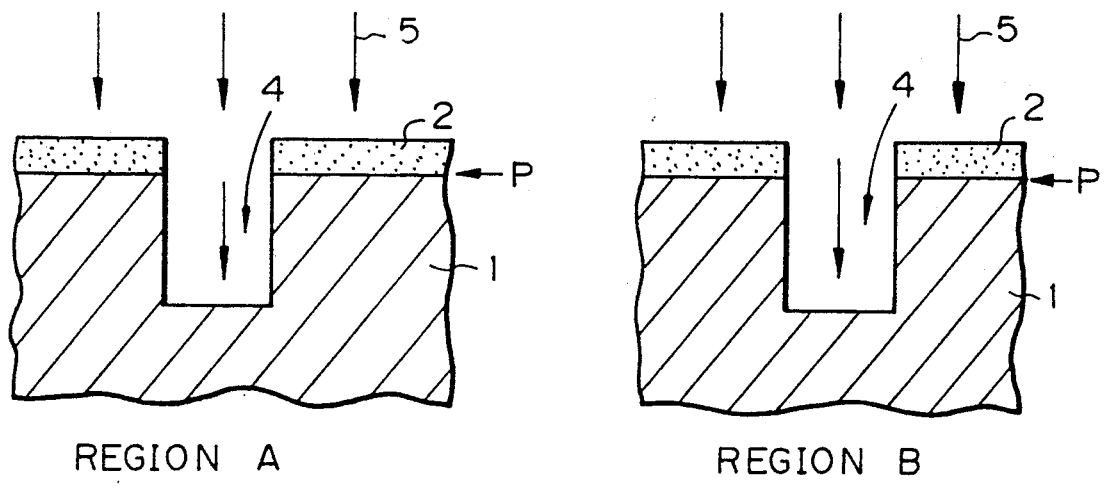

Then, as shown in FIG. 2B, a trench etching process is carried out under the following etching conditions, using a reactive ion etching device (RIE device):

Reactive gas ... carbon tetrachloride ($CCl_4$) + chlorine gas ($Cl_2$)

Pressure in reaction chamber ... 0.1 Torr

High frequency electrical power ... 700 W

In FIG. 2B, 4 denotes a trench and 5 denotes ions of the reactive gas.

Figure 2C:
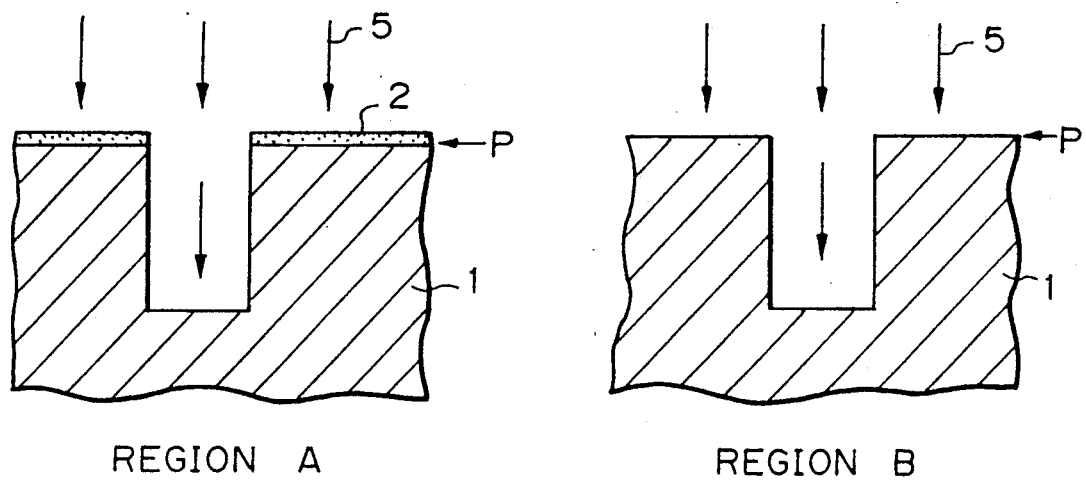

As the RIE etching progresses, the PSG film 2 may be completely removed at a portion, for example, region B, of the silicon substrate but still remains at, for example, region A, due to, for example, a deviation of the thickness of PSG film 2 on the surface of the silicon substrate, or the surface roughness, etc., as shown in FIG. 2C.

Figure 2D:
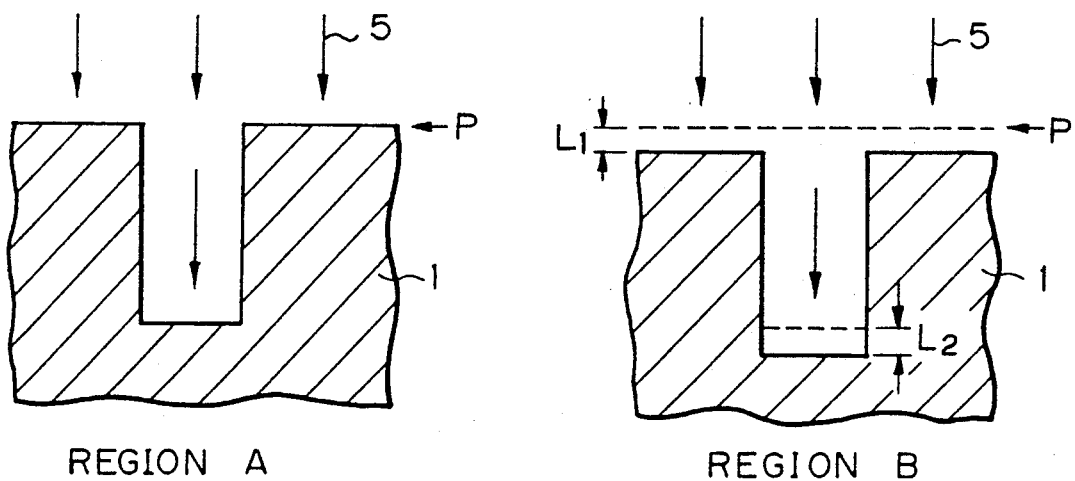

When the etching has progressed beyond the step shown in FIG. 2C, the PSG film 2 can be completely removed from all portions of the surface of the silicon substrate, including the regions A and B, as shown in FIG. 2D. When the PSG film 2 is completely removed, as shown in FIG. 2D by the RIE process, a spectral emission having a wavelength of 603 nm appears. Further, when only a silicon oxide film formed during the etching process on the side wall portion of the trench 4 remains, this spectral emission having a wavelength of 603 nm is remarkably reduced, and thus, when the spectral emission has vanished or is remarkably reduced, it is determined that the trench etching is completed.

The time from the removal of the mask, i.e., the PSG film 2, at one portion to the time of the completion of the etching varies at different positions of the wafer surface, and the depth of the trench formed by etching after the mask has been removed varies as a result of the difference of the etching speeds for the trench per se and for the surrounding surface of the silicon substrate 1.

Nevertheless, since the material of the inner portion of the trench and of the surrounding surface is the same, i.e., silicon, there is no difference in the etching speed thereof. Further, the period from the removal of the mask to the end of the trench etching is very short, compared with the total etching period.

Therefore, there is no deviation of depths of trenches in different regions during the period from the removal of the mask to the completion of the etching, with the result that the depths of the trenches are substantially the same over the entire surface of the wafer, e.g., the silicon substrate. Namely, the depth $L_1$ is substantially the same as the depth $L_2$, and thus the depth of a trench in region B is the same as that of a trench in region A, and thus, according to the present invention, a control of the etching process to provide a distribution of trenches in different regions of the substrate but all having the same depth can be achieved.

The reason why the depths of the trenches in regions A and B are substantially the same is due to the mask thickness ($D_1$ and $D_2$), the etching rates of the masks ($M_1$ and $M_2$), and the etching rates of silicon ($S_1$ and $S_2$) in the respective regions A and B, as explained below. Namely, provided that the etching rates of the silicon substrate 1 and the PSG film 2 (mask) in the region B are larger than those in the region A, the ratio of the depths $T_2$ and $T_1$ of trenches in the regions A and B will be as shown by the following expression $$T_2/T_1 = S_2/S_1 \times M_1/M_2 \times D_2/D_1$$

and provided that the mask thickness is same (i.e., $D_1 = D_2$), and that the ratios of the etching rates are expressed as $$S_2/S_1 = 1 + \alpha, M_2/M_1 = 1 + \beta,$$

then, $$T_2/T_1 = (1+\alpha)/(1+\beta) = 1 + (\alpha-\beta)/(1+\beta)$$

Note, when $\alpha$ is compared with $(\alpha-\beta)/(1+\beta)$, $\alpha$ is larger than $(\alpha-\beta)/(1+\beta)$, and consequently, $T_2/T_1$ is nearer to 1 than $S_2/S_1$, with the result that a more uniform trench etching depth can be obtained.

The above theory is proved by FIG. 3, which illustrates a relationship between the etching time and the depth of trenches in region A and B of the silicon substrate. The steps I, II and III in FIG. 3 correspond to FIGS. 2B, 2C, and 2D, and show the first stage, the middle stage, and the completion of the trench etching.

In the first and middle stages I and II, the depth of the trench in the region B is slightly larger than that in region A, but on the other hand, upon completion of the etching, the depth of the trench in the region B is slightly less than that in region A.

We claim:
1. A trench etching process comprising the steps of:
   preparing a silicon substrate having a main surface through which trenches are to be formed, extending into the substrate, by trench etching;
   directly forming a mask on the main surface of the substrate, the mask being patterned to expose the main surface of the substrate at positions at which said trenches are to be formed, the mask material having a different etching rate from the etching rate of said silicon substrate; and
   simultaneously etching both said patterned mask material and the exposed portions of the main surface of the substrate until said patterned mask material on said main surface of said silicon substrate is completely removed and spectroanalyzing the emissions produced by said etching; and
   detecting the complete removal of said patterned mask material by detecting the corresponding change in the emission spectroanalysis and, correspondingly, determining that said trench etching is completed.

2. A trench etching process according to claim 1, wherein said mask material pattern comprises phosphosilicate glass or a thermal oxide of silicon.

3. A trench etching process according to claim 1, wherein said trench etching is performed by reactive ion etching.

* * * * *